United States Patent
Cirkel

(10) Patent No.: US 7,035,749 B2
(45) Date of Patent: Apr. 25, 2006

(54) TEST MACHINE FOR TESTING AN INTEGRATED CIRCUIT WITH A COMPARATOR

(75) Inventor: Cornelis Oene Cirkel, Nijmegen (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 10/496,419

(22) PCT Filed: Nov. 20, 2002

(86) PCT No.: PCT/IB02/04903

§ 371 (c)(1),
(2), (4) Date: May 21, 2004

(87) PCT Pub. No.: WO03/046590

PCT Pub. Date: Jun. 5, 2003

(65) Prior Publication Data

US 2005/0004775 A1    Jan. 6, 2005

(30) Foreign Application Priority Data

Nov. 26, 2001    (EP) .................................. 01204542

(51) Int. Cl.
G01R 31/00 (2006.01)
(52) U.S. Cl. ................ 702/117; 702/64; 702/182; 324/537
(58) Field of Classification Search ............ 702/64–66, 702/81–82, 117–118, 124, 185, 182–183, 702/189–191, 193, 199; 700/32–33, 292–293; 324/537, 763, 76.39; 327/72–73, 77–78, 327/80, 345, 363
See application file for complete search history.

(56) References Cited

U.S. PATENT DOCUMENTS

| 4,503,465 | A | * | 3/1985 | Wine | 348/735 |
| 4,564,821 | A | * | 1/1986 | Reichart | 331/74 |
| 4,807,147 | A | * | 2/1989 | Halbert et al. | 702/66 |
| 5,629,875 | A | * | 5/1997 | Adair, Jr. | 702/122 |
| 5,970,074 | A |   | 10/1999 | Ehiro | |
| 6,104,968 | A | * | 8/2000 | Ananth | 700/297 |
| 6,573,762 | B1 | * | 6/2003 | Wessendorf et al. | 327/100 |

FOREIGN PATENT DOCUMENTS

| JP | 56-022974 | 3/1981 |
| JP | 63-234170 | 9/1988 |

* cited by examiner

*Primary Examiner*—Marc S. Hoff
*Assistant Examiner*—Mary Catherine Baran

(57) ABSTRACT

A test machine (10) is provided with a integrating circuit (102) so that when a integrated circuit (12) is inserted in the test machine an external feedback loop between an input (120*a*) and an output (124*a*) of a comparator (122) in the integrated circuit under test is established. Thus an input voltage of the comparator (122) oscillates around a threshold level of the comparator (122). A test result is determined dependent on an average value of an oscillating voltage in the feedback loop. In an embodiment the feedback loop is realized with a digital test tester (100, 104, 106) with an added analog integrating circuit added to its output (14).

20 Claims, 4 Drawing Sheets

TEST MACHINE FOR TESTING AN INTEGRATED CIRCUIT WITH A COMPARATOR

The invention relates to the field of integrated circuit testing and in particular to testing of the threshold voltage of comparators.

A comparator is a circuit that outputs one logic level or another, dependent on whether its input voltage is above or below a threshold voltage. In many integrated circuits, the threshold level of comparators, and in particular the relative offset between the threshold levels of different comparators, is a critical performance parameter that needs to be tested before the integrated circuit can be approved for use.

This means that the test procedure can not be limited to a simple test in which a high and a low voltage are applied to the comparator successively and its output is monitored to determine whether the logic level of the output when the input voltage changes between the high and low level. It has to be tested where the threshold level is located.

Testing for a threshold level is normally performed by applying a series of input voltages to the comparator and reading the resulting output voltages. In the simplest embodiment a staircase (gradually rising) series of input voltage is used. Such a test takes a considerable amount of time. In a more complex embodiment a binary search is performed, each time applying an input voltage midway between the lowest known voltage that is known to be above the threshold level and the highest known voltage that is known to be below the threshold level. Such a test is faster than the staircase test, but it still takes considerable time. Moreover, this kind of test is vulnerable to small instabilities of the threshold. An additional problem with both tests is that they require a dedicated analog test machine, which makes testing more expensive than normal binary testing.

Amongst others, it is an object of the invention to provide for a test system, a test machine and a method of testing that reduces test time and is robust against instability of the threshold level.

The method of testing according to the invention is set forth in claim 1. By using a feedback loop to bring the comparator in oscillation and using an average value of oscillation voltage to determine the test result a reliable estimate of the threshold voltage is obtained quickly during the test.

The average value may be used, for example, to select test voltages to test the threshold voltages of an additional comparator that needs to have a threshold voltage with a predetermined offset with respect to the threshold value of the comparator. A further test of this additional comparator may be performed by applying voltages on either side of the voltage with the predetermined offset to this additional comparator, so as to test whether this additional comparator produces logically complementary output signals in response to these voltages. In another example, the threshold voltages of both comparators may be measured and compared.

Many integrated circuits contain a plurality of comparators that are normally not directly accessible from outside the integrated circuit. In this case, the integrated circuit may contain a switching circuit to connect individual comparators to the external contacts of the integrated circuit one after another. In this case, the feedback loop may be used to test the plurality of comparators one after another.

In an embodiment a digital test machine is used, wherein a digital test pattern is generated in the feedback loop. An analog integrating (NB "-ing", not necessarily integrat "-ed") circuit, for example a low pass RC filter, has been inserted between the test pattern generator to integrate the digital test pattern. The (average) output level of the test pattern is changed when the comparator output voltage makes a transition. Thus with little extra cost a conventional digital tester may be used to test accurate threshold levels of comparators.

These and other objects and advantageous aspects of the system, method and machine according to the invention will be described in more detail using the following figures.

Figure 1:
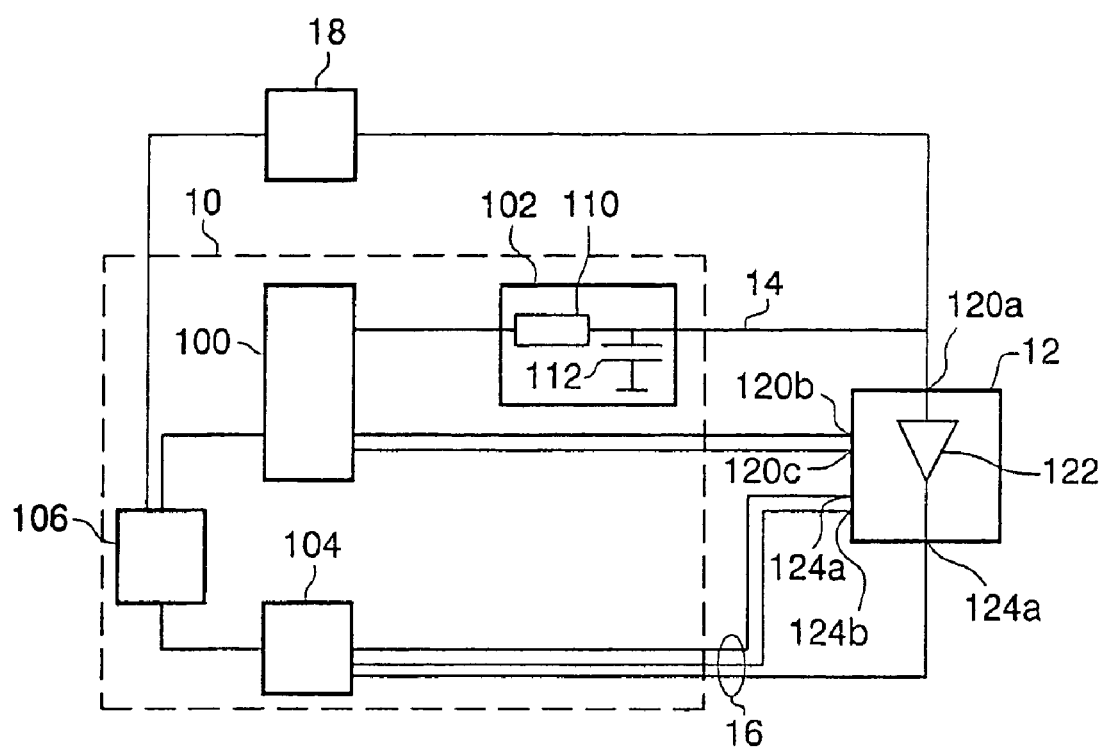
FIG. 1 shows a digital test system.

FIG. 1 shows a test system. The test system contains a test machine 10, an integrated circuit under test 12 and an average measuring circuit 18. The test machine contains a test pattern generator 100, an integrating circuit 102, a digital response pattern measuring circuit 104 and a controller 106. Controller 106 is coupled to the test pattern generator 100 and the measuring circuit 104. The test pattern generator 100 is coupled to contacts 120a–c of the integrated circuit 12 via output 14. Further contacts 124a–c of the integrated circuit 12 are connected to the measuring circuit 104 via inputs 16. By way of example integrating circuit 102 is shown to contain a resistor 110 and a capacitor 112. The resistor 110 is connected in series between the test pattern generator 100 and the outputs 14. The capacitor 112 is connected between the output 14 and ground (in practice, a buffer circuit (not shown) may be included between the capacitor 112 and the output 14, so as to prevent influence of the connecting wiring on the integration). Average measuring circuit 18 has an input coupled to the input of integrating circuit 102 and an output coupled to controller 106.

Integrated circuit 12 contains a comparator 122 with an input that is coupled to a first one 120a of the contacts and an output that is connected to a second one 124a of the contacts.

In operation test machine 10 makes use of conventional binary testing capabilities to realize a robust analog test. Controller 106 directs test pattern generator 100 to generate a binary test pattern and to supply this test pattern to its outputs. Measuring circuit 104 subsequently reads binary responses, in response to the test pattern.

Many conventional test machines operate under control of a test program that indicates the test signal values that have to be output in successive clock cycles. Table I illustrates such a program.

TABLE I

| Address | Drive | Compare | Instruction |
|---------|-------|---------|-------------|
| 100 | 0 | — | |
| 101 | Z | 1 | yes: 200; no: 100 |
| 102 | Z | — | |
| 103 | Z | — | |
| 104 | Z | — | |
| . | | | |
| . | | | |
| 199 | Z | — | |
| 200 | 1 | — | |
| 201 | Z | 0 | yes: 100; no: 200 |
| 202 | Z | — | |
| 203 | Z | — | |
| . | | | |
| . | | | |

The instructions of the program are stored at successive addresses in a memory (not shown) in controller 106. The leftmost column of table I contains the addresses of a number of addresses in this memory. At each address, information is stored that defines: (1) the digital signal pattern that should be output by the generator 100, (2) a response signal expected to be measured by response pattern measuring circuit 104 and (3) an action to be taken by controller 106.

The controller 106 contains an address counter (not shown) that addresses the memory. Thus, normally the addresses are addressed successively, the digital signal pattern defined by the address being output by generator 100. A part of the digital signal pattern that is relevant to the invention is shown in the second column of table I, for the addresses included in the first column. According to a first address (100) a digital "1" is output to integrating circuit 102. According to a second address (102) the output to the integrating circuit is brought to a high impedance state (Z) and so on. At address "200" pattern generator 100 will output a digital "0" to integrating circuit 102.

The third column of table I contains a part of the response signal that is relevant to the invention and the fourth column contains instructions relevant to the invention. As shown in the third column of table I, a second address (101) indicates that a response "1" is expected from the output contact 124*a* of the comparator when the address counter addresses this address. The fourth column indicates that if this pattern is detected, the controller 106 should change the value in its address counter to "200" and if not to "100". Thus, the test machine 10 will keep the test pattern value at the input of integrating circuit 102 digital "1" as long as the comparator 122 keeps outputting a digital "0" and the test machine 10 will switch this test pattern value to "0" when the comparator 122 starts outputting a digital "1".

Similarly thereafter, as indicated by the rows for addresses 200 and 201 in table I, the test machine 10 will keep the test pattern value at the input of integrating circuit 102 digital 0 as long as the comparator 122 keeps outputting a digital "1" and the test machine 10 will switch this test pattern value to "1" when the comparator 122 starts outputting a digital "0" again and so on.

Figure 2:
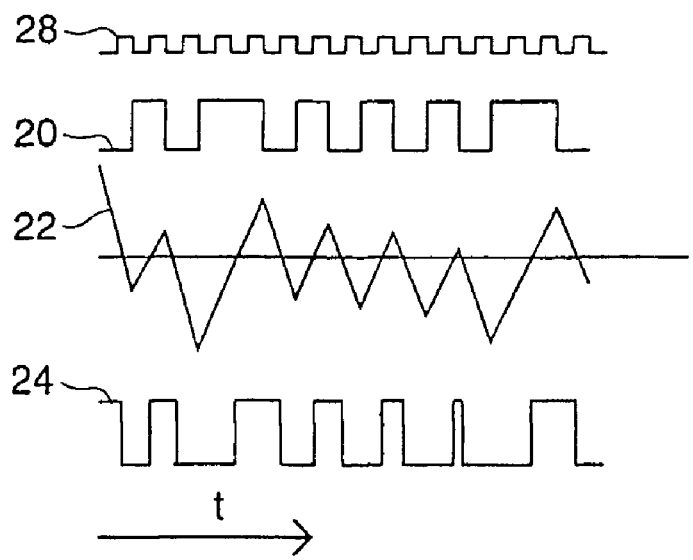
FIG. 2 shows test signal.

FIG. 2 shows a test pattern 20 that may be generated in principle by test pattern generator 100 as a function of time "t", an integrated voltage 22 formed at the output of integrating circuit 102 in response to the test pattern 20, a comparator output voltage 24 formed at the output of comparator 122 in response to the integrated voltage 22 and a clock signal 28. To illustrate the principle of the invention a minimum of delay is shown between transitions in the various signals. Note that there is generally a delay between transitions in the various signals, if only because the test pattern generator 100 makes transitions only on edges of the clock signal 28 and because the comparator 122 may also be a clocked comparator, changing its output only on clock transitions (not necessarily the same clock 28 as that of the test machine 10).

The use of integrating circuit 102 and a feedback coupling the measuring circuit 104 to test pattern generator 100 via controller 106 makes it possible to use these binary testing capabilities to control an analog test of the comparator 122. In an initial phase, controller 106 causes the integrated voltage to approach a low value. This may be realized by causing the test pattern generator 100 to output a binary low level signal over an period of time that is longer than the time constant of integrating circuit 102. Alternatively, a switch, for example implemented using a switching transistor (not shown) may be included between the node between the resistor 110 and the capacitor 112 and ground. This switch may be controlled by a signal from the test pattern generator 100 to initialize the voltage at the output of the integrating circuit 102.

Controller 106 causes test pattern generator 100 to output a signal with a high level to integrating circuit 102 in a second phase. This causes the integrated voltage 22 to rise. More generally, the signal 20 may contain both higher level values and low level values. In this case the average speed with which the integrated voltage 22 rises and the final level that it reaches will depend on the short term average level of signal 20. Different short term average levels may be realized by using different duty cycles of the signal. (The duty cycle of a binary signal 20 is defined as the fraction of time that the binary signal is logic high. In the case of a permanently high signal as shown the duty cycle is said to be 100%. This causes the output voltage 22 of integrating circuit 102 to rise).

When measuring circuit 104 detects that the logic output level 24 of comparator 122 changes in response to rising the output voltage 22 of integrating circuit 102, controller 106 starts a third phase in which it commands test pattern generator 100 to lower the level of the binary output signal 20 so that the output voltage 22 of integrating circuit 102 drops.

When measuring circuit 104 detects that the logic output level 24 of comparator 122 changes in response to the drop in output voltage 22 of integrating circuit 102, controller 106 starts a fourth phase in which it commands test pattern generator 100 to raise the level of the binary output signal 22 again. The level is made so low (on average) that the output voltage 22 of integrating circuit 102 rises again. Controller 106 repeats the third and fourth phase a number of times.

As a result the integrated voltage 22 will oscillate between values above and below the threshold voltage of comparator 122. Average measuring circuit 18 performs this measurement, averaging over a number of phases 26*c*–*d*. The result of the average measurement is supplied to controller 106 for use in further testing or for determining a test decision to accept or reject integrated circuit 12. Of course average measuring circuit need not be connected to the output 14 itself. Any point in the circuit whose average voltage level is determined by integration of the output voltage of the output signal from pattern generator 100 may be used instead of the output 14.

Alternatively, the measurement of the average level may be determined from the signals received by digital measuring circuit 104. From the average, the net number of clock cycles (net: difference between number of clock cycle in which the input signal 20 to the integrating circuit 104 minus the number of clock cycles in which the input signal 20 was high) after which the output of the comparator is seen to switch can be determined. Furthermore, as will be explained below, when only relative threshold levels of comparators in the integrated circuit need to be tested, it may be unnecessary to determine the actual threshold level explicitly.

In many test apparatuses a particular problem is that the test apparatus has a considerable pipeline delay. That is, although the test pattern generator 100 is able to change the logic level of the output signal 20 once every clock cycle, it takes a certain minimum number of clock cycles between the time that the test pattern generator 100 is commanded to output a certain logic level at a certain output and the time that this logic level is actually output and results in a change in direction of the integrated signal 22. Also there is a number of clock cycles between the time that comparator 122 outputs an output signal 24 and the test controller 106 gets access to the measurement of this output signal from measuring circuit 104. As a result of the pipeline delay it is impossible to make the integrated voltage 22 drop immediately in the next clock cycle after a change in logic level at the output of comparator 122.

In terms of the example of table I the pipeline delay causes a delay between the clock cycle in which controller 106 read information from the address "101" as shown in the second row of table I and the clock cycles in which (1) the test pattern of the second column from that row is output by test pattern generator 100 and (2) the result of comparison indicated in the third column reaches back to the controller 106. Hence the command implied by the content of the various columns from a single row of table I is effected in different clock cycles and it will take a number of clock cycles before the controller is able to respond. In table I it has been assumed that this takes 99 clock cycles, i.e. that the response to the comparison indicated in the second column will only be effected when the controller has reached address "199". In the mean time the drive output is brought to the high impedance state (Z). This is indicated with hatched area's 21 in the test pattern 22. Thus, the integrated signal 22 will remain constant during this delay period.

Alternatively, the input signal of the integrating circuit 102 might be kept constant (1's and 0's in the second column of table I instead of Z's). In this case, an overshoot of the integrated voltage results, which increases required test time and reduces test accuracy. Of course a certain amount of overshoot will always occur during oscillation, but by not driving the input of the integrating circuit during the pipeline delay this overshoot can be reduced.

Figure 2A:
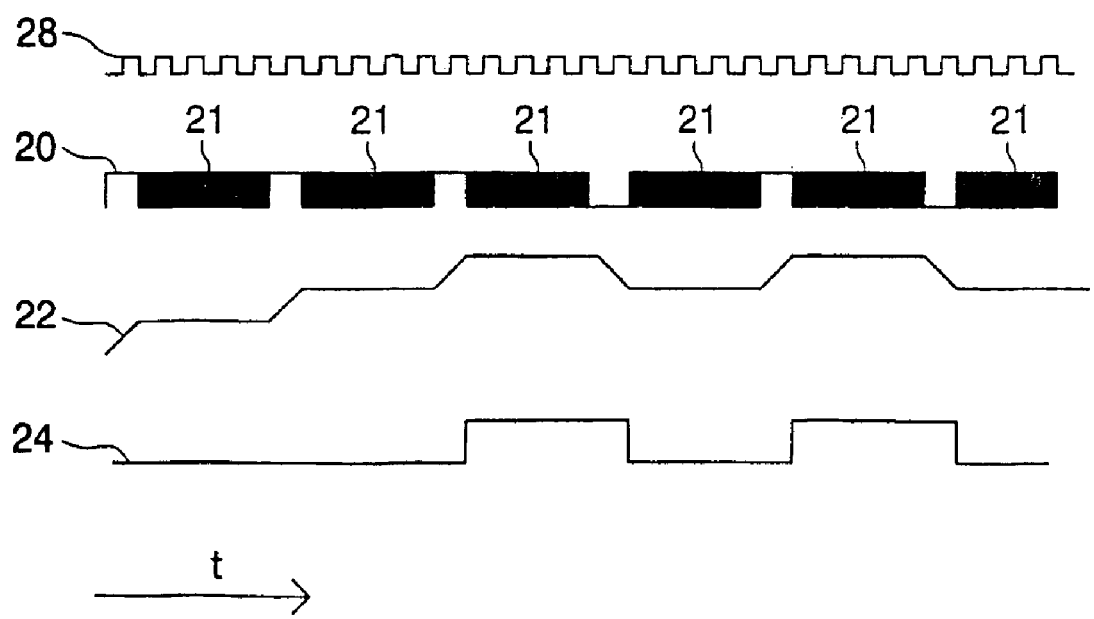
FIG. 2A shows further test signals.

FIG. 2A shows signals with delays. Time intervals 21 in which the pattern generator 100 creates a high impedance (Z) state at its output to the integrating circuit 102 are indicated by shaded areas 21. It will be seen that the signal 22 at the output 14 of the integrating circuit 102 rises and falls in steps each time that the pattern generator 100 is not in a high Z state and that it takes a number of periods of clock signal 28 (four by way of example) before test pattern generator responds to transitions in the output signal 26 of comparator 122. This delay is due first of all to the delay between the time when a transition occurs in signal 26 and the time detection of this transition reaches controller 106 and furthermore to the delay between a command from controller 106 and its effectuation by pattern generator 100.

Figure 3:
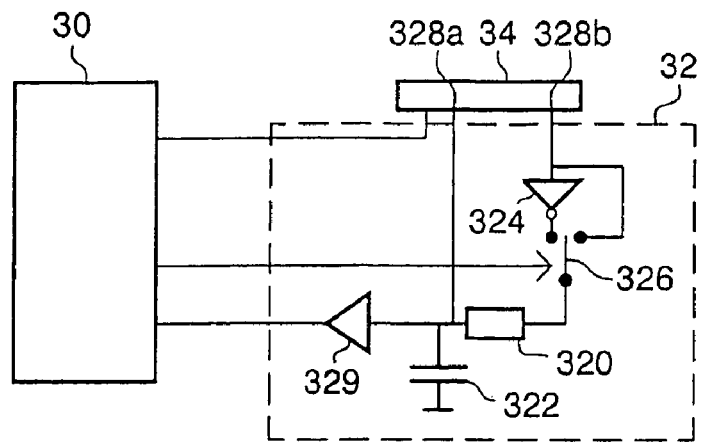
FIG. 3 shows an analog test system.

FIG. 3 shows an analog test system that contains a test controller 30, a type dependent interface (TDI) 32 and a device under test 34. The test dependent interface 32 has contacts 328*a,b* to the device under test 34 and contains an inverter 324, a switch 326 and an integrating circuit 320, 322 with a resistor 320 and a capacitor 322.

The switch 326 connects a first one of the contacts 328*a* to a first terminal of the resistor 320 either directly or via the inverter 324. A second terminal of the resistor 320 is connected to ground via the capacitor 322 and to a second one of the contacts 328*a*. The test controller 30 is connected to the device under test 34 via the TDI 32. It has control outputs coupled to the device under test 34 and to the switch 326. It has a measurement input coupled to the second terminal of the resistor 320 via a buffer circuit 329.

In operation, the test controller 30 controls the device under test 34 to connect the input of a comparator (not shown) to the second one of the contacts 328*b* and the output of the comparator to the first one of the contacts 328*a*. Test controller 30 controls switch 326 dependent on the polarity of the comparator: if a high input voltage leads to a logic high output voltage, the output of the comparator is connected to the first terminal of the resistor 320 via the inverter 324, if a high input voltage leads to a logic low output voltage the output of the comparator is connected to the first terminal of the resistor 320 directly. Thus the comparator will cause an oscillation of the voltage at the second terminal of the resistor 320 around the threshold level of the comparator. Test controller 30 measures the average voltage at this terminal to conduct the test.

It is advantageous to incorporate the feedback loop with the integrating circuit 320, 322 in the test dependent interface (TDI) 32. The TDI is a small circuit, which is placed in the test bed in which the device under test 34 is inserted for testing, much closer to the device under test 34 than the test controller 30, which is normally in a cabinet because it is much larger than the TDI (32). Keeping the feedback loop local in the TDI, a high frequency oscillation is possible without significant disturbance from external signals.

Figure 4:
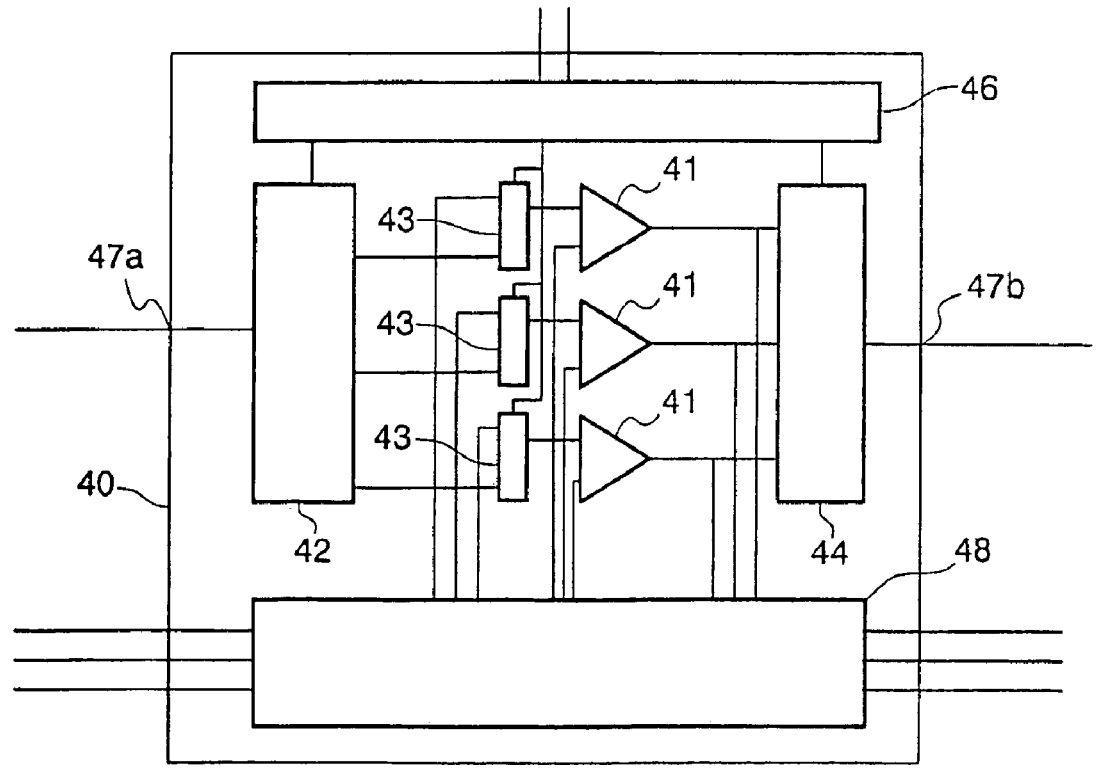
FIG. 4 shows an integrated circuit.

FIG. 4 shows a more detailed view of an integrated circuit 40. The integrated circuit 40 contains a functional circuit 48, comparators 41, a test control unit 46, an input multiplexer 42, an output multiplexer 44 and local multiplexers 43. Under control of test control unit 46, local multiplexers 43 connect the comparators 41 either to the internal functional circuit 48 or between an external input 47*a* and output 47*b* of the integrated circuit. In the latter case, the input multiplexer 42 and output multiplexer 44 determine which one of the comparators 41 is connected between input 47a and output 47b.

In a normal mode of operation, the integrated circuit 40 uses the comparators internally in cooperation with the functional circuit, to perform whatever function the integrated circuit 40 is intended for. With external signals, the integrated circuit can be brought into a test mode, in which test control unit 46 causes local multiplexers 43 to decouple one or more of the inputs of the comparators 41 from the functional circuit 48 (although each comparator is shown to have only one input that can be decoupled, the integrated circuit may also be arranged to decouple a selectable one of the inputs). The decoupled input of a selectable one of the comparators 41 is connected to the external test input 47a and the output of this comparator 41 is coupled to the external output 47b.

This enables the test systems of FIG. 1 or FIG. 3 to perform tests on a number of comparators sequentially. In this case, the comparator may be connected to the integrating circuit one after the other. Each comparator 41 in turn may be brought into oscillation and its threshold may be determined from the average input signal applied to the external input 47a during the oscillation as part of the test.

However, in some cases only the relative threshold levels of a group of comparators 41 needs to be tested. In that case it may be advantageous to used the threshold determined for a first one of the comparators 41 of such a group as a starting point for second ones of the comparators 41 of the rest of the group. This may be done either using a go/no go test for the second comparators 41, by successively applying two voltages to each of the second comparators 41. The second comparator 41 under test should have its own threshold voltage at a predetermined offset to the measured threshold determined for the first comparator 41. The two voltages applied to the second comparator 41 each have a predetermined offset to the threshold voltage determined for the first comparator 41, so that these voltages lay on both sides of the intended threshold of the second comparator 41 under test. Thus the test of the second comparator 41 is performed faster than when an oscillation is used.

As an alternative the threshold of the second comparator may be determined with an oscillation, starting from an initial level derived from the measured threshold level of the first comparator. The initial level is chosen so that it is ensured that the initial level is on one side of the threshold when the second comparator operates properly, but closer to this level than the supply voltage level. Thus, the test time is reduced because no integration time is needed to reach the initial level.

Figure 5:
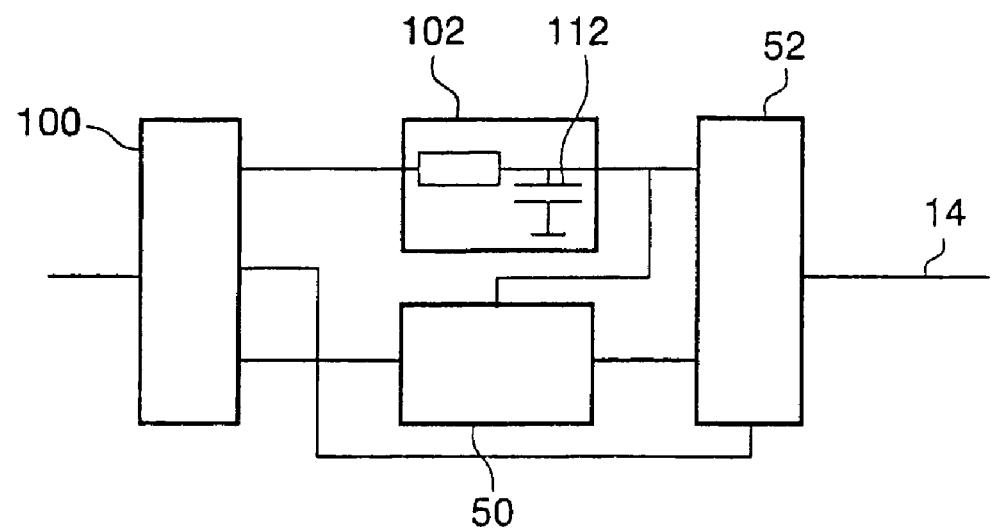
FIG. 5 shows an detail of a test machine.

FIG. 5 shows a modification to part of the test system of FIG. 1 for this test method. FIG. 5 shows the test pattern generator 100, the integrating circuit 102, a voltage controller 50 and a multiplexer 52.

In operation during test of the threshold level of the first comparator, the output of the integrating circuit 102 is applied via the output 14 to the integrated circuit under test (not shown). At the end of this test, voltage controller 50 samples an averaged value of the output voltage of the integrating circuit 102. Preferably, this is done under control of a signal from test pattern generator 100. Subsequently, test pattern generator 100 outputs signals to the integrated circuit under test to connect a second comparator to the external pins. Subsequently, test pattern generator 100 signals voltage controller 50 to output successive voltages with predetermined offsets to the sample voltage from integrating circuit 102. Test pattern generator 100 signals multiplexer 52 to pass these voltages to the integrated circuit under test instead of the output signal of the integrating circuit 102. The response to these voltages is monitored to test these comparators. Of course, dependent on the test connections of the integrated circuit under test, these voltages may be applied via other outputs as well.

In another embodiment voltage controller 50 merely initializes the output voltage of the integrating circuit 102 to a new initial value to test the second comparator 41.

Figure 6:
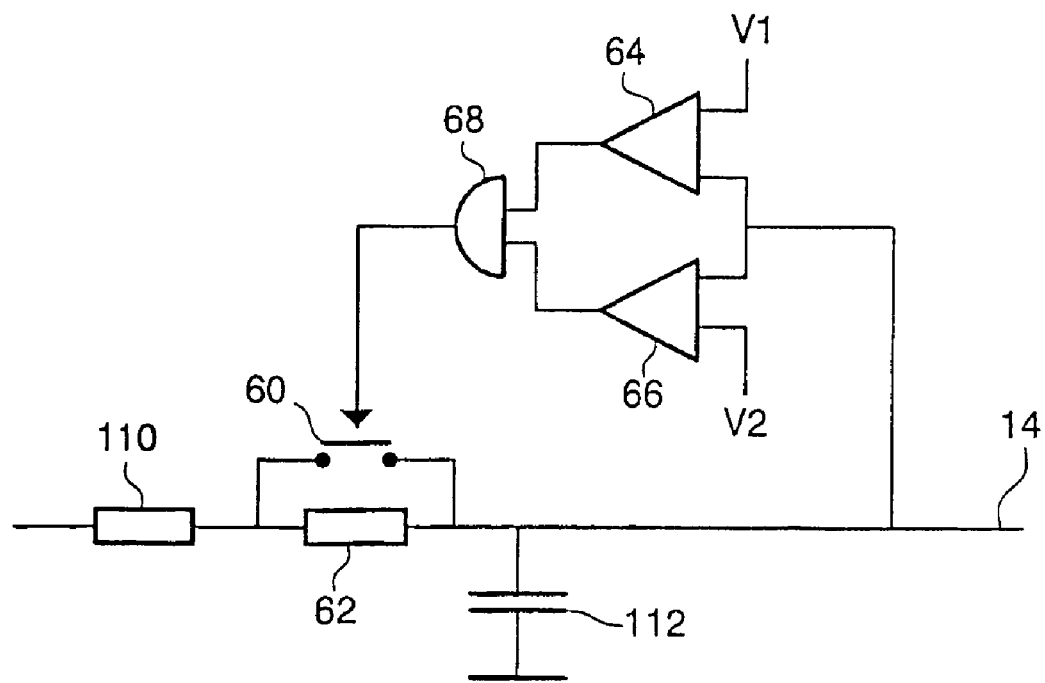
FIG. 6 shows an integrating circuit.

FIG. 6 shows a further embodiment of the integrating circuit of FIG. 1. An additional resistor 62 has been included in series with resistor 110. A switch 60 is provided in parallel with this additional resistor 62 to short circuit the additional resistor 62. A first and second comparator 64, 66 and an AND gate 68 are also added. The first comparator 64 has a reference input coupled to a first voltage V1. The second comparator 66 has a reference input coupled to a second voltage V2. The comparators 64, 66 have a further input jointly coupled to the output 14 of the integrating circuit. The outputs of the comparators are coupled to the AND gate 68, which in turn controls switch 60.

In operation comparators 64, 66 define a voltage range from V1 to V2 in which the threshold level of comparator 122 should lie. When the voltage at the output 14 of the integrating circuit is outside this range, the integration speed of the integrating circuit is increased. When the voltage at the output 14 is within the range V1–V2 the speed is decreased. In the embodiment of FIG. 6 this is done by adding and removing a short circuit of the additional resistor 62 with switch 60, but of course other ways of changing the speed are conceivable. As a result, test time is gained because less time is needed to reach the range of voltages V1–V2 that contains the threshold level of comparator 122 and accuracy is gained because a smaller overshoot of the threshold level occurs with the decreased integration speed.

In FIG. 3, test controller 30 may perform a series of tests on different comparators in the device under test 34, by applying test control signals device 34 connect the different comparators to the contacts 328a,b one after the other. Dependent on the polarity of the comparator that is connected, test controller 30 sets switch 236 to cause oscillation and measures the resulting average voltage at the second terminal of resistor 320. In the case of the digital test machine of FIG. 1, this inversion is realized by test controller 106, through the selection of control signals for test pattern generator 100.

It will be understood that, without deviating from the invention, several variations are possible in the circuit of FIG. 3. For example, a non-inverting buffer may be added instead of the direct connection between the contact 328a and the first terminal of the resistor 320. Or, a more complicated integrating circuit may be used, using for example current sources that charge the capacitor 322 and are switched on and off by the output of the comparator instead of the resistor 320.

Furthermore, if only the relative levels of the thresholds of different comparators need to be tested with high accuracy, it is not necessary to measure the actual average level of the voltage during oscillation. It suffices that different comparators are tested with voltages at predetermined offsets with respect to the oscillating voltage. If a low accuracy test of the threshold levels of comparators is needed in addition to the high accuracy relative test, simple go/no go tests may be performed in addition to the oscillating test, applying high and low voltages to the comparators and monitoring their output signals.

The invention claimed is:

1. A method of testing a first integrated circuit under test, the first, integrated circuit comprising at least a first comparator, the method comprising:
   providing a test machine with a second, integrating circuit;
   connecting an input and an output of the first, integrated circuit to the test machine so as to establish an external feedback loop between the input and the output of the first, integrated circuit through the test machine, the feedback loop containing the second, integrating circuit;
   controlling the feedback loop so as to make an input voltage of the first comparator oscillate around a threshold level of the first comparator; and
   determining an average value of an oscillating voltage in the feedback loop to thereby enable a determination of a test result of the first, integrated circuit.

2. A method according to claim 1, wherein the first, integrated circuit further comprises a second comparator, the method comprising:
   generating test voltages with predetermined offsets to the average value; and
   applying the test voltages to an input of the second comparator to test whether a threshold level of the second comparator is between the test voltages.

3. A method according to claim 1, wherein the first, integrated circuit further comprises a second comparator, the method comprising:
   measuring a threshold voltage of the second comparator; and
   passing or rejecting the first, integrated circuit based on an offset between the average voltage and the measured threshold voltage of the second comparator.

4. A method according to claim 1, further comprising:
   arranging a digital test pattern generator in the test machine to generate a digital test pattern, the second, integrating circuit being an analog integrating circuit;
   applying an integrated voltage from the second, integrating circuit to the input of the first comparator;
   coupling a digital measuring circuit to the output of the first comparator; and
   coupling the digital measuring circuit to the test pattern generator to select a time dependence of the digital test pattern so that a level of the binary voltage switches repeatedly between values that cause the integrated voltage to rise or fall respectively, each time upon detection of a transition at the output of the first comparator.

5. A test method according to claim 1, wherein the first, integrated circuit comprises a plurality of comparators including said first, comparator, and a switching circuit arranged to control which of the plurality of comparators has its input and output coupled via said feedback loop, the method comprising:
   causing the switching circuit to connect the comparators to the feedback loop one after another, and
   the test result being determined from average voltages obtained when respective ones of the comparators are coupled to the feedback loop.

6. A method according to claim 1, further comprising testing the first, integrated circuit by directing a signal from the test machine to the input of the first, integrated circuit to thereby form the input voltage of each of the first comparator.

7. A method according to claim 1, further comprising controlling the feedback loop so as to produce a variable integrated voltage at the output of the second, integrating circuit which is used as the input voltage of the first comparator.

8. A method according to claim 1, wherein the determination of the average value of the oscillating voltage in the feedback loop is determined by an average measuring circuit coupled to an output of the second, integrating circuit.

9. A method according to claim 1, further comprising:
   arranging a test pattern generator in the test machine and in the feedback loop;
   arranging a controller in the test machine and in the feedback loop to control the test pattern generator to generate a binary test pattern which is provided to the second, integrating circuit; and
   arranging a digital response pattern measuring circuit in the test machine and in the feedback loop between the first, integrated circuit and the controller.

10. A test system for testing a first, integrated circuit comprising at least a first comparator, the test system comprising:
    a test machine including a second, integrating circuit;
    a feedback loop for connection between an input and an output of the first, integrated circuit through the test machine, the feedback loop containing the second, integrating circuit and being arranged to make an input voltage of the first comparator oscillate around a threshold level of the first comparator; and
    test result determining means for determining an average value of the oscillating input voltage in the feedback loop to thereby enable a determination of a test result of the first, integrated circuit.

11. A test system according to claim 10, wherein the first, integrated circuit further comprises a second comparator, the test machine being arranged to generate test voltages with predetermined offsets to the average value and to apply the test voltages to the first, integrated circuit under test to test whether a threshold level of the second comparator is between the test voltages.

12. A test system according to claim 10, wherein the first, integrated circuit further comprises a second comparator, the test machine being arranged to measure a threshold voltage of the second comparator and to pass or reject the integrated circuit based on an offset between the average voltage and the measured threshold voltage of the second comparator.

13. A test system according to claim 10, comprising:
    contacts for connecting the test machine to the first, integrated circuit;
    the test machine comprising a digital test pattern generator having an output coupled to the contacts;
    the second, integrating circuit being an analog integrating circuit and being arranged between the test pattern generator and a first one of the contacts that is coupled to an input of the first comparator, the second, integrating circuit being arranged to apply an integrated voltage that is an integral as a function of time of a binary voltage from the test pattern generator;

the test machine further comprising a digital response pattern measuring circuit having an input coupled to a second one of the contacts that is coupled to an output of the first comparator, the measuring circuit being coupled to the test pattern generator to select a time dependence of the binary voltage so that a level of the binary voltage switches repeatedly between values that cause the integrated voltage to rise or fall respectively, each time upon detection of a transition at the output of the first comparator.

14. A test system according to claim 13, the test machine being arranged to set the output of the digital test pattern generator to a high impedance state each time after switching to said levels during a pipeline delay of the test machine, whereby an overshoot of the integrated voltage after the transition is reduced.

15. A test system according to claim 13, further comprising a circuit to adjust an integration speed of the second, integrating circuit dependent on the integrated voltage so that the integration speed is reduced when the integrated voltage is within a predetermined range around an expected threshold voltage of the first comparator.

16. A test system according to claim 10, wherein the first, integrated circuit comprises a plurality of comparators including said first comparator and a switching circuit arranged to control which of the plurality of comparators has its input and output coupled via said feedback loop, the test machine comprising control means to cause the switching circuit to connect the comparators to the feedback loop one after another.

17. A test system according to claim 10, wherein said test result determining means comprises an average measuring circuit connected to an output of the second, integrating circuit.

18. A system according to claim 17, wherein the test machine comprises a test pattern generator and a controller for controlling the test pattern generator to generate a binary test pattern which is provided to the second, integrating circuit, the average measuring circuit being connected to the controller to provide the average value of the oscillating input voltage to the controller and the controller being arranged to control the test pattern generator based thereon.

19. A system according to claim 10, wherein the test result determining means are arranged external of the test machine.

20. A system according to claim 10, wherein the test result determining means comprise a digital response pattern measuring circuit arranged in the test machine and in the feedback loop.

* * * * *